(12) United States Patent
Yang et al.

(10) Patent No.: US 10,262,958 B2
(45) Date of Patent: Apr. 16, 2019

(54) PACKAGE WITH SOLDER REGIONS ALIGNED TO RECESSES

(71) Applicant: Taiwan Semiconductor Manufacturing Company, Ltd., Hsinchu (TW)

(72) Inventors: Ching-Jung Yang, Pingzhen (TW); Hsien-Wei Chen, Hsinchu (TW); Hsien-Ming Tu, Zhubei (TW); Chang-Pin Huang, Yangmei Township (TW); Yu-Chia Lai, Zhunan Township (TW); Tung-Liang Shao, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/945,006

(22) Filed: Apr. 4, 2018

(65) Prior Publication Data
US 2018/0226370 A1    Aug. 9, 2018

Related U.S. Application Data

(60) Division of application No. 15/417,942, filed on Jan. 27, 2017, now Pat. No. 9,947,630, which is a
(Continued)

(51) Int. Cl.
*H01L 23/48* (2006.01)
*H01L 23/053* (2006.01)
(Continued)

(52) U.S. Cl.
CPC ........ *H01L 24/02* (2013.01); *H01L 21/76802* (2013.01); *H01L 23/3171* (2013.01);
(Continued)

(58) Field of Classification Search
CPC ... H01L 2224/0401; H01L 2224/04026; H01L 2224/05; H01L 2224/05009;
(Continued)

(56) References Cited

U.S. PATENT DOCUMENTS

| 5,933,713 A | 8/1999 | Farnworth |
| 7,271,086 B2 | 9/2007 | Tang et al. |

(Continued)

FOREIGN PATENT DOCUMENTS

| CN | 101174601 A | 5/2008 |
| CN | 102496606 A | 6/2012 |
| CN | 102629584 A | 8/2012 |

*Primary Examiner* — Hsien Ming Lee
(74) *Attorney, Agent, or Firm* — Slater Matsil, LLP

(57) ABSTRACT

A method includes forming a passivation layer over a portion of a metal pad, forming a polymer layer over the passivation layer, and exposing the polymer layer using a photolithography mask. The photolithography mask has an opaque portion, a transparent portion, and a partial transparent portion. The exposed polymer layer is developed to form an opening, wherein the metal pad is exposed through the opening. A Post-Passivation Interconnect (PPI) is formed over the polymer layer, wherein the PPI includes a portion extending into the opening to connect to the metal pad.

20 Claims, 9 Drawing Sheets

Related U.S. Application Data continuation of application No. 13/926,981, filed on Jun. 25, 2013, now Pat. No. 9,559,044.

(51) Int. Cl.
| | |
|---|---|
| *H01L 23/00* | (2006.01) |
| *H01L 23/498* | (2006.01) |
| *H01L 23/31* | (2006.01) |
| *H01L 21/768* | (2006.01) |
| *H01L 23/522* | (2006.01) |

(52) U.S. Cl.
CPC ........ *H01L 23/49811* (2013.01); *H01L 24/03* (2013.01); *H01L 24/05* (2013.01); *H01L 24/11* (2013.01); *H01L 24/13* (2013.01); *H01L 23/5226* (2013.01); *H01L 2224/0239* (2013.01); *H01L 2224/02125* (2013.01); *H01L 2224/02311* (2013.01); *H01L 2224/02351* (2013.01); *H01L 2224/02375* (2013.01); *H01L 2224/02381* (2013.01); *H01L 2224/0346* (2013.01); *H01L 2224/0347* (2013.01); *H01L 2224/0362* (2013.01); *H01L 2224/0391* (2013.01); *H01L 2224/03464* (2013.01); *H01L 2224/03622* (2013.01); *H01L 2224/0401* (2013.01); *H01L 2224/05008* (2013.01); *H01L 2224/05018* (2013.01); *H01L 2224/05082* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05184* (2013.01); *H01L 2224/05548* (2013.01); *H01L 2224/05555* (2013.01); *H01L 2224/05558* (2013.01); *H01L 2224/05563* (2013.01); *H01L 2224/05569* (2013.01); *H01L 2224/05572* (2013.01); *H01L 2224/05582* (2013.01); *H01L 2224/05644* (2013.01); *H01L 2224/05647* (2013.01); *H01L 2224/05655* (2013.01); *H01L 2224/05664* (2013.01); *H01L 2224/1132* (2013.01); *H01L 2224/11849* (2013.01); *H01L 2224/131* (2013.01); *H01L 2224/13007* (2013.01); *H01L 2224/13022* (2013.01); *H01L 2224/13024* (2013.01); *H01L 2224/13147* (2013.01); *H01L 2224/73204* (2013.01); *H01L 2924/01029* (2013.01); *H01L 2924/14* (2013.01); *H01L 2924/181* (2013.01)

(58) Field of Classification Search
CPC . H01L 2224/05011; H01L 2224/13025; H01L 2224/13026; H01L 2224/13028; H01L 24/02; H01L 24/03; H01L 24/06; H01L 24/11; H01L 23/5226; H01L 23/528
USPC ................ 438/612–614; 357/690, 698, 700, 357/734–738, 749, 780, 781; 257/690, 257/698, 700, 734–738, 749, 780, 781
See application file for complete search history.

(56) References Cited

U.S. PATENT DOCUMENTS

| | | |
|---|---|---|
| 7,659,632 B2 | 2/2010 | Tsao et al. |
| 8,324,003 B2 | 12/2012 | Kang et al. |
| 2003/0032276 A1 | 2/2003 | Kim |
| 2006/0252225 A1 | 11/2006 | Gambee et al. |
| 2008/0061436 A1 | 3/2008 | Yang et al. |
| 2011/0104888 A1 | 5/2011 | Kim et al. |
| 2013/0256871 A1 | 10/2013 | Topacio et al. |
| 2014/0077356 A1* | 3/2014 | Chen .................. H01L 23/3192 257/737 |

* cited by examiner

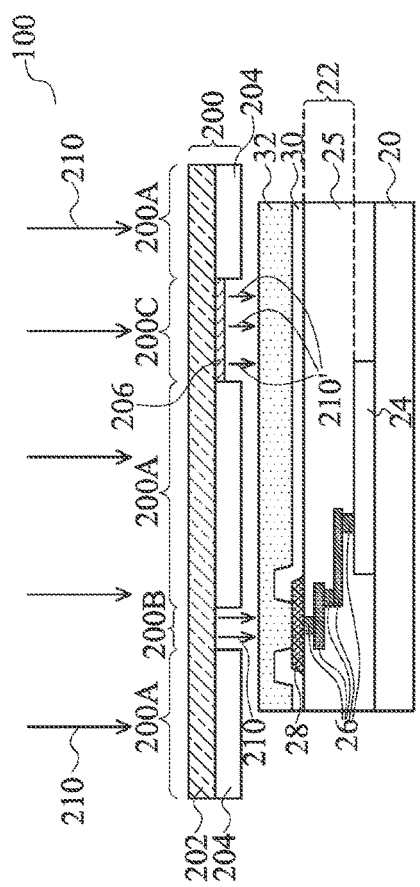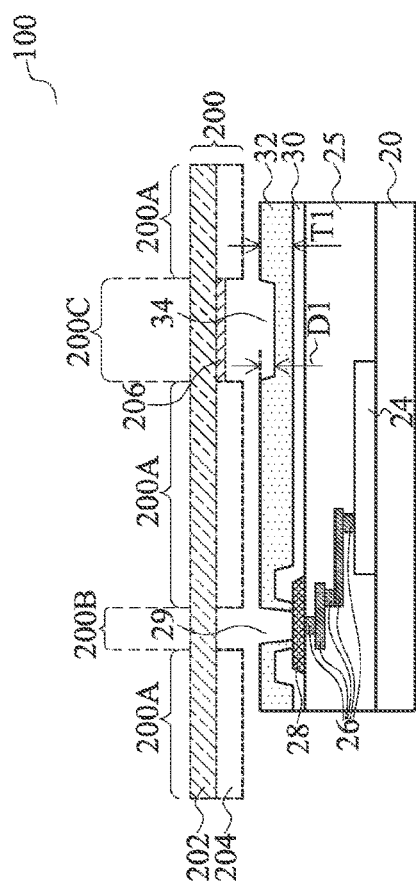

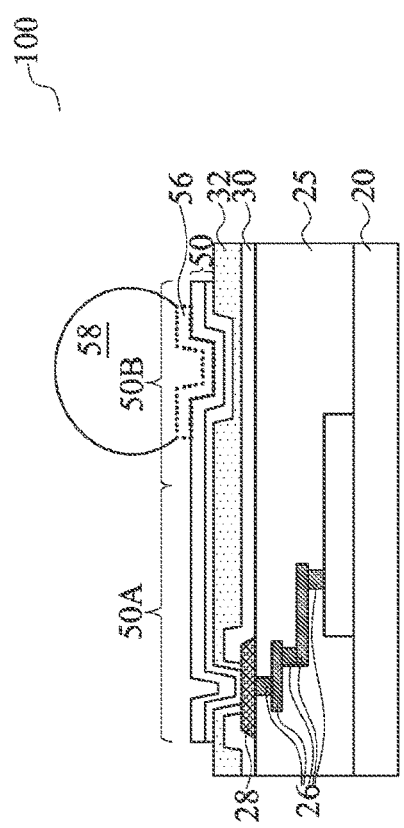
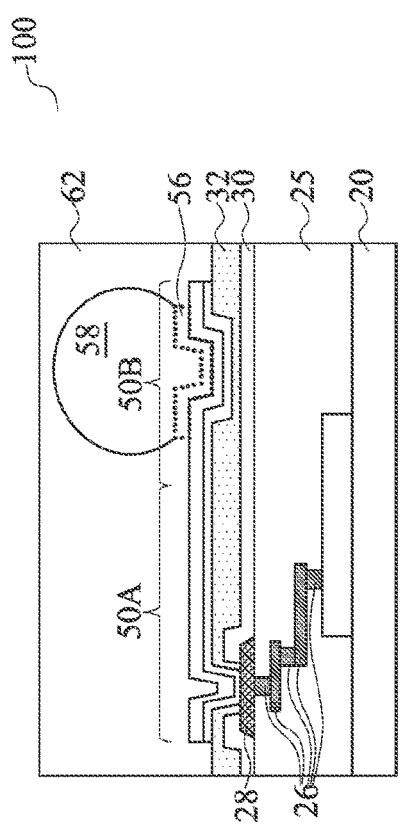

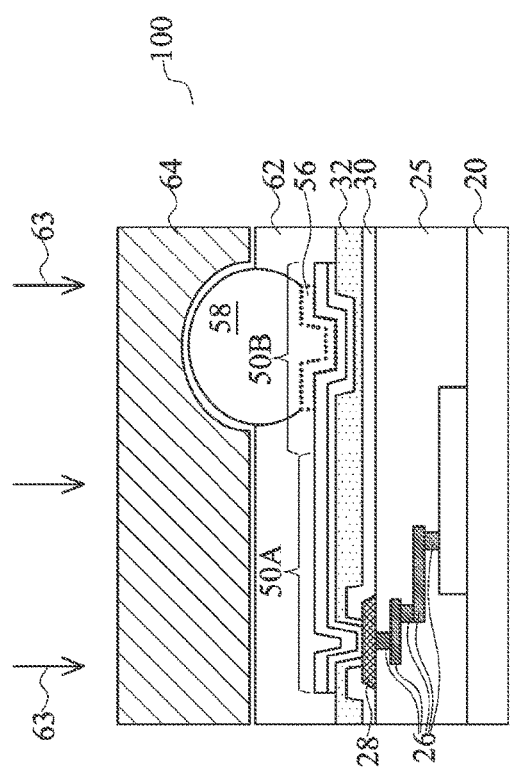
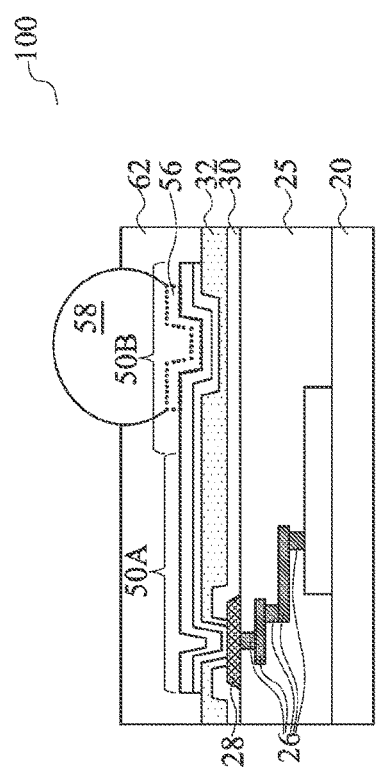

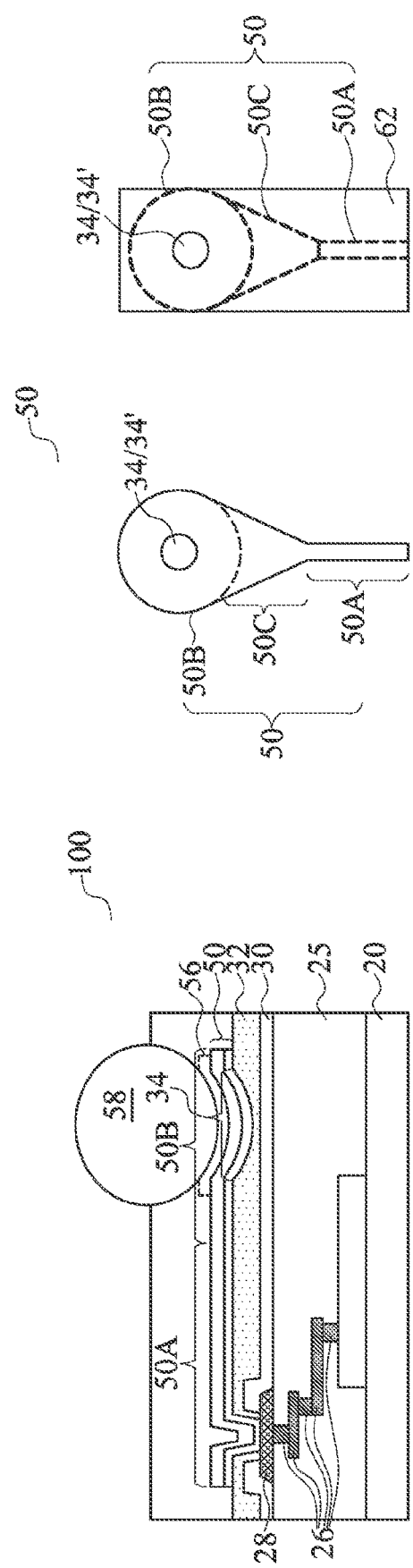

PACKAGE WITH SOLDER REGIONS ALIGNED TO RECESSES

PRIORITY CLAIM AND CROSS-REFERENCE

This application is a divisional of U.S. patent application Ser. No. 15/417,942, entitled, "Package With Solder Regions Aligned to Recesses," filed on Jan. 27, 2017, which is a continuation of U.S. patent application Ser. No. 13/926,981, entitled "Package With Solder Regions Aligned to Recesses," filed on Jun. 25, 2013, now U.S. Pat. No. 9,559,044 issued Jan. 31, 2017, which application is incorporated herein by reference.

BACKGROUND

In the integrated circuit manufacturing process, integrated circuit devices, such as transistors, are first formed at the surface of a semiconductor substrate in a wafer. An interconnect structure is then formed over the integrated circuit devices. Metal pads are formed over, and are electrically coupled to, the interconnect structure. A passivation layer and a first polymer layer are formed on the metal pads, with the metal pads exposed through the openings in the passivation layer and the first polymer layer. A Post-Passivation Interconnect (PPI) structure is then formed, which includes redistribution lines connected to the metal pads. A second polymer layer is then formed over the PPI. Under-Bump-Metallurgies (UBMs) are formed to extend into the openings in the second polymer layer, wherein the UBMs are electrically connected to the PPI. Solder balls are then placed over the UBMs and reflowed.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 12 are cross-sectional views of intermediate stages in the manufacturing of a wafer in accordance with some exemplary embodiments;

FIG. 13 illustrates a cross-sectional view of a portion of wafer in accordance with some exemplary embodiments, wherein a recess in a polymer layer has a curved bottom;

FIGS. 14 and 15 illustrate top views of a Post-Passivation Interconnect (PPI) structure in accordance with some exemplary embodiments.

DETAILED DESCRIPTION

Figure 3:
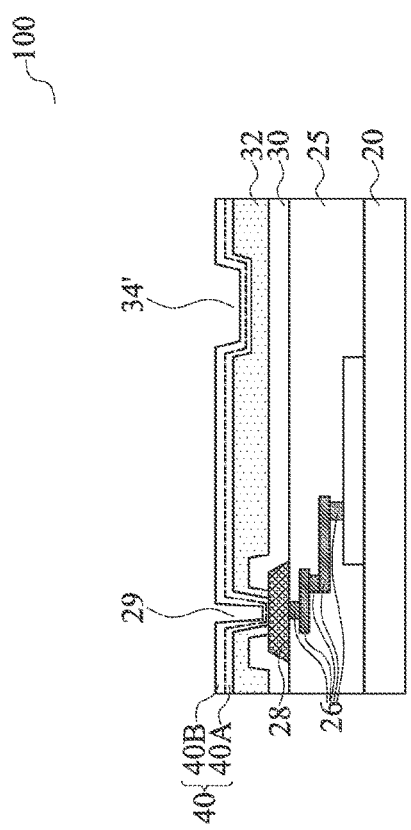

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A method for forming a Post-Passivation Interconnect (PPI) structure, an overlying solder region, and the resulting structure are provided in accordance with some embodiments. The intermediate stages of forming a respective wafer in accordance with some exemplary embodiments are illustrated. The variations of the embodiment are then discussed. Throughout the various views and illustrative embodiments, like reference numbers are used to designate like elements.

Referring to FIG. 1, wafer 100 is provided. Wafer 100 includes substrate 20, which may be a semiconductor substrate, such as a silicon substrate, although it may be formed of other semiconductor materials, such as silicon germanium, silicon carbon, gallium arsenide, or the like. Semiconductor devices 24, such as transistors, may be formed at the surface of substrate 20. Interconnect structure 22, which includes metal lines and vias 26 formed therein, is formed over substrate 20, and is electrically coupled to semiconductor devices 24. The metal lines and vias may be formed of copper or copper alloys, and may be formed using damascene processes. Interconnect structure 22 may include dielectric layers 25, which may include an Inter-Layer Dielectric (ILD, not shown) and Inter-Metal Dielectrics (IMDs, not shown). In alternative embodiments, wafer 100 is an interposer wafer or a package substrate, and is substantially free from integrated circuit devices including transistors, resistors, capacitors, inductors, and/or the like.

Metal pad 28 is formed over interconnect structure 22. Metal pad 28 may comprise aluminum (Al), copper (Cu), silver (Ag), gold (Au), nickel (Ni), tungsten (W), alloys thereof, and/or multi-layers thereof. Metal pad 28 may be electrically coupled to semiconductor devices 24, for example, through the underlying interconnect structure 22. Passivation layer 30 may be formed to cover the edge portions of metal pad 28. In some exemplary embodiments, passivation layer 30 comprises a silicon oxide layer and a silicon nitride layer over the silicon oxide layer, although other dielectric materials may be used. An opening is formed in passivation layer.

Polymer layer 32 is formed over passivation layer 30, wherein polymer layer 32 extends into the opening in passivation layer 30. Polymer layer 32 comprises a photo sensitive material, which may be a positive photo sensitive material or a negative photo sensitive material. For example, polymer layer 32 may comprise polyimide, polybenzoxazole (PBO), or the like. Polymer layer 32 is cured after it is applied on passivation layer 30. In some embodiments, polymer layer 32 has a planar surface in some embodiments.

In subsequent steps, polymer layer 32 is patterned. In some embodiments, partial-tone (also referred to as a partial tone) photolithography mask 200 is used to perform the exposure of polymer layer 32. Photolithography mask 200 includes portions 200A, 200B, and 200C. Portions 200A are opaque portions for blocking light 210, which is used for exposing polymer layer 32. Transparent portion 200B is a transparent portion, wherein light 210 is able to pass through with no degradation in the light intensity. Partial-blocking portions 200C, which are also partial-transparent portions, blocks a desirable percentage of the light 210, so that the light intensity LI2 of light 210', which is the part of the light passing through partial-blocking portions 200C, is lower than the light intensity LI1 of light 210. In some embodiments, partial blocking portions 200C has light-passing rate LI2/LI1 greater than about 0.2, 0.3, 0.4, 0.5, 0.6, or any other positive value smaller than 1.0. Light-passing rate LI2/LI1 may also be smaller than about 0.8, 0.7, 0.6, 0.5, 0.4, or any other positive value greater than 0.0. As a comparison, opaque portions 200A may block greater than about 99 percent of the light (measured using light intensity), and transparent portion 200B may allow more than 99 percent of the light (measured using light intensity) to pass through. It is realized that depending on the material of photolithography mask 200, the light-passing rate and light-blocking rate of portions 200A and 200B may vary slightly.

In some embodiments, photolithography mask 200 includes transparent substrate 202, which may be formed of glass, quartz, or the like. An opaque layer 204 is formed on substrate 202. Opaque layer 204 is patterned, and the remaining portions of opaque layer 204 form the opaque portions 200A. Some portions of substrate 202 do not have opaque layer 204 thereon, and hence the respective portions are transparent portions 200B or partial transparent portions 200C. In some exemplary embodiments, opaque layer 204 comprises chromium, although other materials that are efficient in blocking light may be used. It is appreciated that whether a layer is transparent or not is related to the material and its thickness. Accordingly, opaque layer 204 is thick enough (with thickness greater than 1,000 Å, for example) to block light. Partial transparent portions 200C may comprise partially transparent layer 206, which is formed of Molybdenum Silicide (MoSi) or other types of materials, and the light-passing ratio LI2/LI1 may be adjusted through the adjustment of the material and/or the thickness of partial transparent layer 206. For example, MoSi layer 206 may have a thickness between about 800 Å and about 1,600 Å.

After the exposure of polymer layer 32 through lithography mask 200, lithography mask 200 is removed. Polymer layer 32 is then developed, and the exposed portions are removed. The resulting structure is shown in FIG. 2. In FIG. 2, lithography mask 200 is illustrated to show the relative positions of some features, although lithography mask 200 is not over wafer 100 at this time. Accordingly, lithography mask 200 is illustrated using dashed lines. As shown in FIG. 2, a portion of polymer layer 32 is aligned to transparent portion 200B when polymer layer 32 is exposed, and hence after the development of polymer layer 32, this portion is removed to form opening 29, through which metal pad 28 is exposed. The portions of polymer layer 32 aligned to opaque portions remain un-removed. The portion of polymer layer 32 aligned to partial transparent portion 200C is partially exposed, which means that although this portion is exposed, the light amount is not enough to cause this portion of polymer layer 32 to be fully removed in the development step. As a result, after the development of polymer layer 32, a top layer of the partially exposed portion of polymer layer 32 is removed, while the bottom layer of the partially exposed portion of polymer layer 32 is not removed. Recess 34 is hence formed in polymer layer 32, which has depth D1 smaller than thickness T1 of polymer layer 32. In some embodiment, ratio D1/T1 is between about 0.2 and 0.8, or between 0.2 and 0.5, although other values may be used. Depth D1 may be greater than about 1.6 μm to allow the subsequently applied solder ball to stay stably in place.

It is appreciated that in the example used in FIGS. 1 and 2, polymer layer 32 is a positive photo material, so that the exposed portions are removed in development step, and un-exposed portions are not removed. Opening 29 and recess 34 may also be formed using the same concept when polymer layer 32 is a negative photo material. In which embodiments, however, the positions of the opaque portions 200A and transparent portion(s) 200B (FIG. 1) are swapped, while the location of partial transparent portion(s) 200C remains.

Next, as shown in FIG. 3, seed layer 40 is formed over polymer layer 32. Seed layer 40 may include layers 40A and 40B. Layer 40A may be a titanium layer, a titanium nitride layer, a tantalum layer, a tantalum nitride layer, or the like. The materials of layer 40B may include copper or copper alloys. In some embodiments, seed layer 40 is formed using physical vapor deposition, while other applicable methods may also be used.

Figure 4:
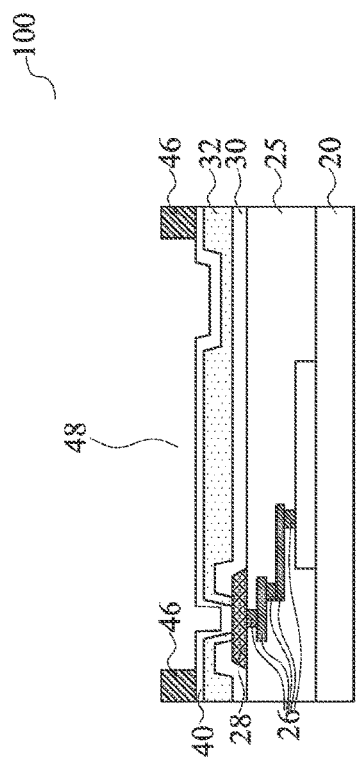
Figure 5:
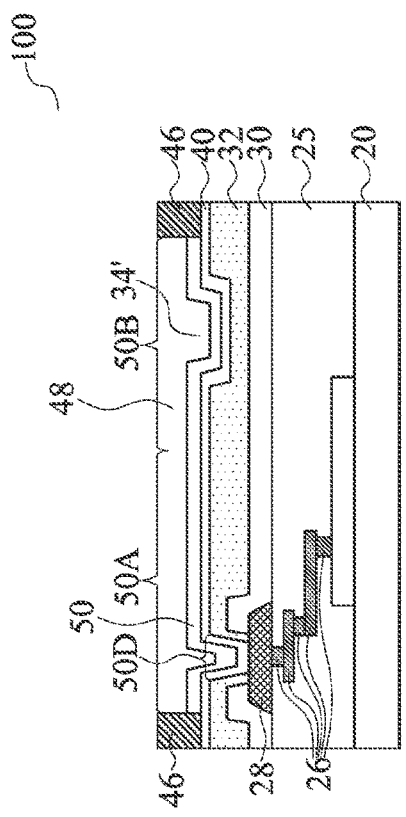

FIG. 4 illustrates the formation of mask 46. In some embodiments, mask 46 is formed of a photo resist, and hence is alternatively referred to as photo resist 46 throughout the description, although other materials may be used. A portion of seed layer 40 is exposed through opening 48 in mask 46. Next, as shown in FIG. 5, a plating step is performed to form PPI 50 in opening 48. PPI 50 may be formed of copper or copper alloys, and may include PPI line 50A, PPI pad 50B, and PPI via 50D. A top view of exemplary PPI 50 is shown in FIG. 14.

Figure 6:
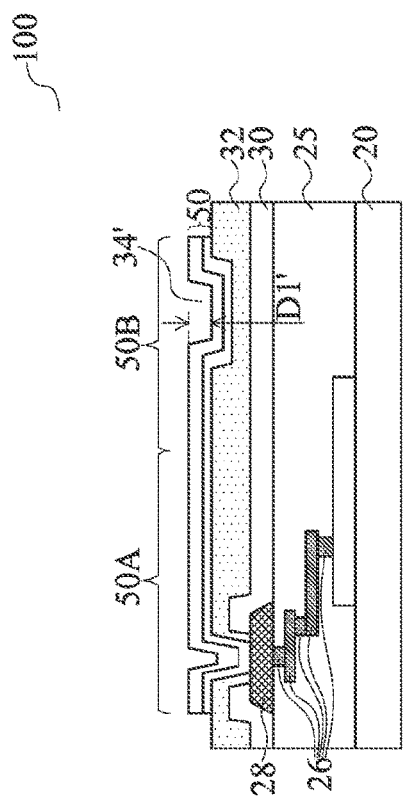

After the formation of PPI 50, mask 46 is removed. Next, the exposed portions of seed layer 40 that were previously covered by photo resist 46 are removed by etching, while the portions of seed layer 40 covered by PPI 50 remain un-removed. The resulting structure is shown in FIG. 6. Throughout the description, the remaining portions of seed layer 40 are considered as parts of PPI 50.

As shown in FIG. 6, PPI pad 50B comprises a portion in recess 34 (FIG. 2) of polymer layer 32. PPI pad 50B may further comprise an additional portion outside recess 34 and over polymer layer 32. PPI pad 50B may be a conformal layer, and hence the portions of PPI pad 50B in recess 34, the portions of PPI pad 50B over polymer layer 32, and possibly the slanted portions on the sidewalls of recesses 34 have substantially the same thickness. Accordingly, recess 34' is formed in PPI pad 50B, and may have depth D1' similar to depth D1 in FIG. 2.

Figure 7:
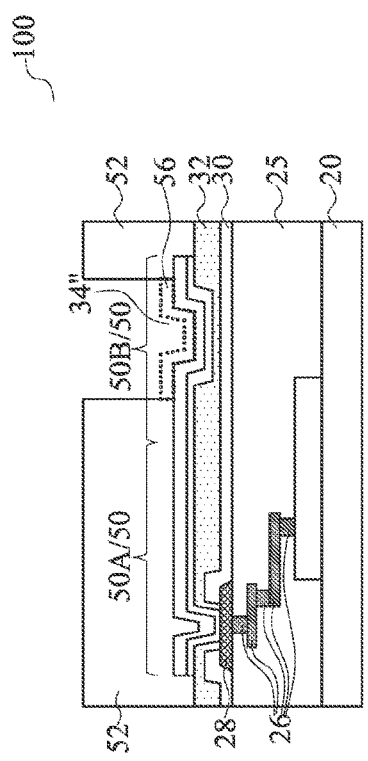

In some exemplary embodiments, as shown in FIG. 7, metal finish 56 is formed on PPI pad 50B. In alternative embodiments, metal finish 56 is not formed, and metal bump 58 (FIG. 8) is attached directly on PPI pad 50B. Accordingly, metal finish 56 is illustrated using dashed lines to indicate that they may or may not exist. In the embodiments in which metal finish 56 are formed, metal finish 56 may be an Electroless Nickel Electroless Palladium Immersion Gold (ENEPIG), which includes a nickel layer, a palladium layer on the nickel layer, and a gold layer on the palladium layer. The gold layer may be formed using immersion plating. In other embodiments, metal finish 56 may be formed of other finish materials and using other methods, including, but not limited to, Electroless Nickel Immersion Gold (ENIG), Direct Immersion Gold (DIG), or the like. In some embodiments, metal finish 56 is formed in the opening in photo resist 52. After metal finish 56 is formed, photo resist 52 is removed. In some embodiments, metal bump 58 is a solder ball, and hence is referred to as solder ball 58 throughout the description, although it may also be other types of metal bumps such as copper balls.

Figure 8:
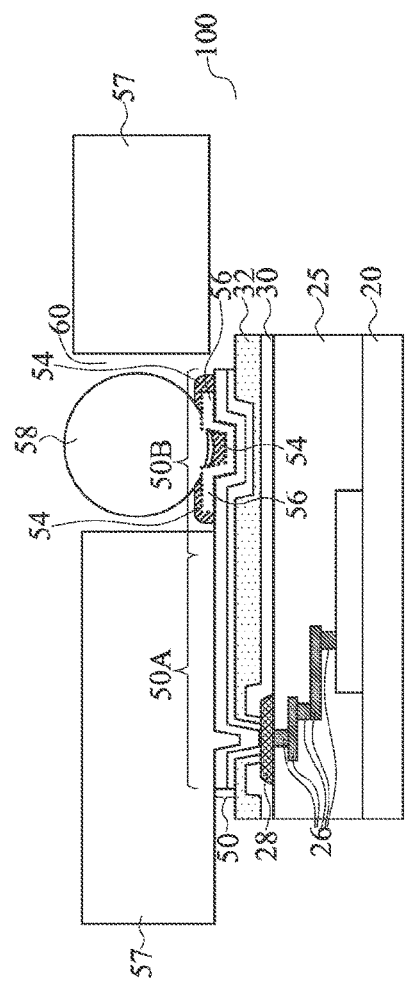

FIG. 8 illustrates the application of flux 54 on PPI pad 50B (or on metal finish 56, if any). Next, stencil 57 is placed on wafer 100, and solder ball 58 is dropped in opening 60 of stencil 57. Opening 60 is aligned to PPI pad 50B, so that solder ball 58 may be accurately placed on PPI pad 50B or metal finish 56. Next, stencil 57 is removed, and a reflow is performed to reflow solder ball 58, and hence solder ball 58 is joined to, and in contact with, PPI pad 50B or metal finish 56. The resulting structure is shown in FIG. 9.

During the reflow of solder ball 58, since solder ball 58 is self-aligned to recess 34' (FIG. 6) and recess 34 (FIG. 2), it is difficult for solder ball 58 to shift in position, and hence the position of solder ball 58 is accurately aligned to the desirable position, which is defined by the opening 60 in stencil 57 (FIG. 8).

Next, as shown in FIG. 10, liquid molding compound 62 is applied on wafer 100, wherein solder ball 58 may be submerged under liquid molding compound 62. Referring to FIG. 11, release film 64 is applied on liquid molding compound 62. A pressure is applied, as shown by arrows 63. Release film 64 is formed of a soft material, so that a portion of solder ball 58 is pressed into release film 64. Furthermore, release film 64 pushes some of liquid molding compound 62 away from the top surface of wafer 100, and the bottom surface of release film 64 is lower than the top end of solder ball 58. With release film 64 remaining being pushed against solder ball 58 and liquid molding compound 62, a curing is performed to cure and solidify liquid molding compound 62. After the solidification of molding compound 62, the top end of solder ball 58 is lower than the top surface of molding compound 62.

Release film 64 is then peeled off from molding compound 62, which is now in a solid form. The resulting structure is shown in FIG. 12. The molding compound residue remaining on the top surface of solder ball 58 is etched. In the resulting structure, molding compound 62 is formed with a portion of solder ball 58 buried therein. The top end of solder ball 58 may be higher than the top surface of molding compound 62.

FIG. 15 illustrates a top view of molding compound 62 and the underlying PPI 50 and recess 34. FIG. 15 illustrates PPI line 50A, PPI pad 50B, and transition portion 50C connecting PPI line 50A to PPI pad 50B. Transition portion 30C may have a gradually changed width, so that the connection between PPI line 50A and PPI pad 50B is not abrupt. Recess 34'/34 may be aligned to the center of PPI pad 50B.

Referring back to FIG. 12, in subsequently steps, wafer 100 is sawed into dies, wherein each of the dies is bonded to another package component such as package substrate, interposer, Printed Circuit Board (PCB), or the like to form a package. Solder ball 58 will also be joined with the conductive feature on the other package component. Since the position of solder ball 58 is accurately defined due to the formation of recess 34 in polymer 32 (FIG. 2), the misalignment between solder ball 58 and the conductive feature of the package component is reduced.

FIG. 13 illustrates a possible profile of PPI pad 50B and metal finish 56, if any. In some embodiments, the recess 34 (filled by PPI pad 50B) in polymer layer 32 has a curved and smooth bottom surface. As a result, metal finish 56 also has curved and smooth top and bottom surfaces. The curved surface may be caused by the optical effects.

Figure 16C:
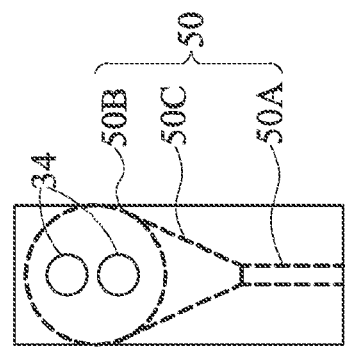
FIGS. 16A through 19 illustrate recesses extending into underlying polymer layers in accordance with various exemplary embodiments.
Figure 16B:
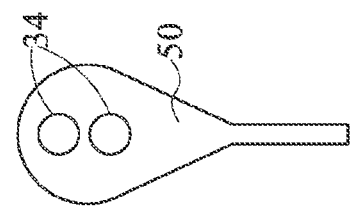
Figure 16A:
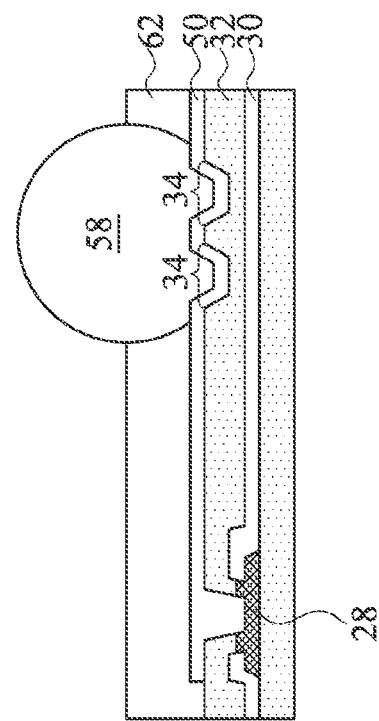

FIGS. 16A through 19 illustrate the cross-sectional views and top views of PPI pad 50B in accordance with alternative embodiments, wherein more than one recess 34 correspond to the same PPI pad 50B. The number of recesses 34 corresponding to each of PPI pad 50B may be any positive integer such as 2, 3, 4, 5, or the like. For example, FIG. 16A illustrates a cross-sectional view of some embodiments, in which there are two recesses 34 formed in polymer layer 32, wherein PPI pad 50B extends into recesses 34. FIG. 16B illustrates a top view of recesses 34 corresponding to what are shown in FIG. 16A. FIG. 16C further illustrates molding material 62.

Figure 19:
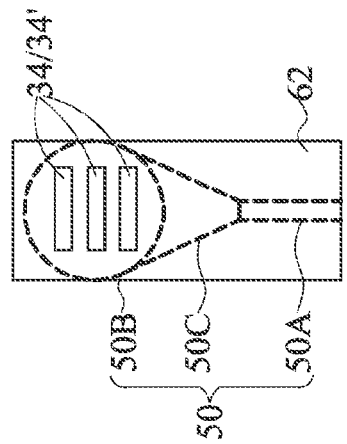
Figure 18:
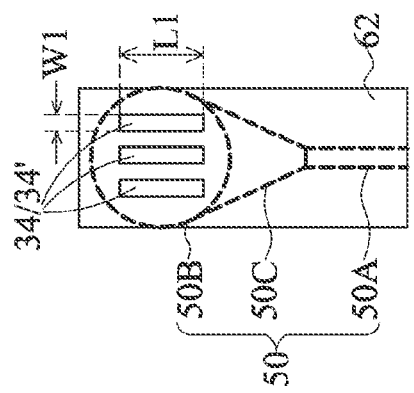
Figure 17:
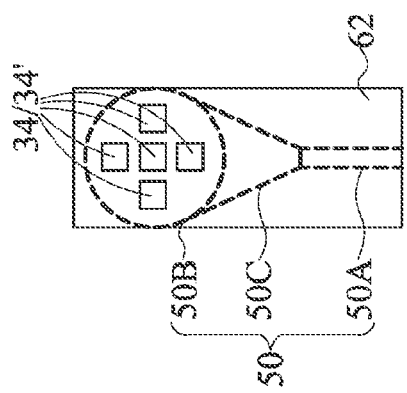

In FIGS. 14, 15, and 16C, recesses 34 have round top view shapes. FIG. 17 illustrates a plurality of rectangular recesses 34/34', which may have square top-view shapes. FIG. 18 illustrates that recesses 34/34' have strip-shapes, for example, with length L1 greater than two times width W1. In FIG. 18, the lengthwise direction of recesses 34 are parallel to the lengthwise direction of the respective connecting PPI line 50A. FIG. 19 illustrates an embodiment similar to what is shown in FIG. 18, except that the lengthwise direction of recesses 34 is perpendicular to the lengthwise direction of the respective connecting PPI line 50A.

In the embodiments of the present disclosure, by using a partial-tone photolithography mask to pattern the polymer layer, on which the PPI is formed, the polymer layer may have a recess formed therein, wherein the PPI pad extends into the recess. The PPI pad hence also has a recess. As a result, the shift in the position of the solder ball placed thereon is substantially eliminated. The embodiments have improved accuracy in the alignment of the solder ball, while no extra manufacturing cost is incurred.

In accordance with some embodiments, a method includes forming a passivation layer over a portion of a metal pad, forming a polymer layer over the passivation layer, and exposing the polymer layer using a photolithography mask. The photolithography mask has an opaque portion, a transparent portion, and a partial transparent portion. The exposed polymer layer is developed to form an opening, wherein the metal pad is exposed through the opening. A Post-Passivation Interconnect (PPI) is formed over the polymer layer, wherein the PPI includes a portion extending into the opening to connect to the metal pad.

In accordance with other embodiments, a method includes forming a passivation layer over a portion of a metal pad, forming a polymer layer over the passivation layer, and patterning the polymer layer to form an opening and a recess. The opening penetrates through the polymer layer, wherein the metal pad is exposed through the opening. The recess extends into but does not penetrate through the polymer layer. A PPI is formed over the polymer layer, wherein the PPI includes a PPI via extending into the opening to connect to the metal pad, and a PPI pad comprising a portion in the recess. The method further includes placing a solder ball over the PPI pad, and performing a reflow on the solder ball. The solder ball is aligned to the recess, and is electrically coupled to the PPI pad.

In accordance with yet other embodiments, a device includes a substrate, a metal pad over the substrate, a passivation layer over a portion of the metal pad, a polymer layer over the passivation layer, and a PPI. The PPI includes a PPI via penetrating through the polymer layer to connect to the metal pad, and a PPI pad electrically coupled to the PPI via. The PPI pad includes a portion extending into a recess of the polymer layer, with the recess extending from a top surface of the polymer to an intermediate level of the polymer layer. A solder region is overlying and electrically coupled to the PPI pad, wherein the solder region is directly over the PPI pad.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
a substrate;
a metal pad over the substrate;
a passivation layer comprising a portion over the metal pad;
a polymer layer over the passivation layer, wherein the polymer layer comprises a plurality of recesses extending from a top surface of the polymer layer into an intermediate level of the polymer layer, wherein the intermediate level is between the top surface and a bottom surface of the polymer layer;
a Post-Passivation Interconnect (PPI) comprising:
a PPI via penetrating through the polymer layer to connect to the metal pad; and
a PPI pad electrically coupling to the PPI via, wherein the PPI pad comprises a first portion extending into the plurality of recesses of the polymer layer;
a metal finish on the PPI pad; and
a solder region overlying and contacting the metal finish, wherein the solder region is spaced apart from the PPI via.

2. The integrated circuit structure of claim 1, wherein the plurality of recesses have top-view shapes of elongated strips.

3. The integrated circuit structure of claim 2, wherein the solder region is continuous, and the continuous solder region extends into the plurality of recesses.

4. The integrated circuit structure of claim 1, wherein the metal finish is over the metal pad, and does not extend over the PPI via.

5. The integrated circuit structure of claim 1, wherein bottom surfaces of an entirety of the PPI pad are in contact with the polymer layer.

6. The integrated circuit structure of claim 1, wherein no metal feature is underlying and contacting bottom surfaces of the PPI pad.

7. The integrated circuit structure of claim 1, wherein the plurality of recesses have a depth, the polymer layer has a thickness, and wherein a ratio of the depth to the thickness is between about 0.2 and about 0.5.

8. The integrated circuit structure of claim 1, wherein the PPI pad further comprises a second portion over a planar surface of the polymer layer.

9. An integrated circuit structure comprising:
a substrate;
a metal pad over the substrate;
a Post-Passivation Interconnect (PPI) over and electrically coupling to the metal pad, the PPI comprising:
a PPI via connecting to the metal pad; and
a PPI pad electrically coupling to the PPI via, wherein the PPI pad comprises a bottom surface, and the bottom surface comprises:
a first portion; and
a second portion extending lower than the first portion; and
a solder region overlying and electrically coupling to the PPI pad, wherein the solder region comprises a portion directly over the second portion of the bottom surface of the PPI pad.

10. The integrated circuit structure of claim 9 further comprising a dielectric layer over the metal pad and underlying the PPI, wherein all bottom surfaces of the PPI pad are in contact with the dielectric layer.

11. The integrated circuit structure of claim 9, wherein no conductive feature is underlying and in contact with the PPI pad.

12. The integrated circuit structure of claim 9, wherein the bottom surface of the PPI pad further comprises a third portion extending lower than the first portion, wherein the second portion and the third portion are separated from each other by the first portion.

13. The integrated circuit structure of claim 12, wherein the solder region further overlaps the first portion and the third portion of the bottom surface of the PPI pad.

14. The integrated circuit structure of claim 9 further comprising a metal finish over the PPI pad, wherein the solder region is in contact with the metal finish.

15. An integrated circuit structure comprising:
a substrate;
a metal pad over the substrate;
a first dielectric layer having a portion over the metal pad, wherein the first dielectric layer is formed of a first dielectric material;
a second dielectric layer over the first dielectric layer, wherein the second dielectric layer is formed of a second dielectric material different from the first dielectric material, and the second dielectric material comprises:
a first top surface; and
a plurality of second top surfaces lower than the first top surface, wherein the plurality of second top surfaces are encircled, and separated from each other, by the first top surface; and
a conductive line comprising:
a via penetrating through the second dielectric layer to connect to the metal pad; and
a pad electrically coupling to the via, wherein the pad has a bottom surface contacting the first top surface and the plurality of second top surfaces of the second dielectric material.

16. The integrated circuit structure of claim 15, wherein all bottom surfaces of the pad are in contact with top surfaces of the second dielectric layer.

17. The integrated circuit structure of claim 15, wherein each of the plurality of second top surfaces has a strip shape in a top view of the integrated circuit structure.

18. The integrated circuit structure of claim 15, wherein the pad comprises:
a main pad portion having a circular top-view shape; and
a transition region, wherein widths of the transition region gradually reduce in a direction pointing away from a center of the main pad portion.

19. The integrated circuit structure of claim 15, wherein the pad comprises a plurality of recessed portions, each in contact with one of the plurality of second top surfaces of the second dielectric material.

20. The integrated circuit structure of claim 19 further comprising a solder region extending into the plurality of recessed portions of the pad.

* * * * *